United States Patent
Lee et al.

(10) Patent No.: US 9,768,753 B2
(45) Date of Patent: Sep. 19, 2017

(54) FILTER USING BAWRS AND L/C ELEMENTS CONNECTED TO THE BAWRS

(75) Inventors: Jae Chun Lee, Yongin-si (KR); Duck Hwan Kim, Yongin-si (KR); Chul Soo Kim, Yongin-si (KR); Ho Soo Park, Yongin-si (KR); Sang Uk Son, Yongin-si (KR); In Sang Song, Yongin-si (KR); Jea Shik Shin, Yongin-si (KR); Moon Chul Lee, Yongin-si (KR); Jing Cui, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 279 days.

(21) Appl. No.: 14/382,115

(22) PCT Filed: Jun. 12, 2012

(86) PCT No.: PCT/KR2012/004612
§ 371 (c)(1),
(2), (4) Date: Feb. 19, 2015

(87) PCT Pub. No.: WO2013/129740
PCT Pub. Date: Sep. 6, 2013

(65) Prior Publication Data
US 2015/0155852 A1    Jun. 4, 2015

(30) Foreign Application Priority Data

Feb. 29, 2012  (KR) .................. 10-2012-0021312

(51) Int. Cl.
*H03H 9/58*   (2006.01)
*H03H 7/38*   (2006.01)
(Continued)

(52) U.S. Cl.
CPC .............. *H03H 9/542* (2013.01); *H03H 7/38* (2013.01); *H03H 9/0095* (2013.01); *H03H 9/58* (2013.01);
(Continued)

(58) Field of Classification Search
CPC ........ H03H 7/38; H03H 9/0095; H03H 9/205; H03H 9/542; H03H 9/566; H03H 9/568; H03H 9/58; H03H 9/60; H03H 9/605
(Continued)

(56) References Cited

U.S. PATENT DOCUMENTS

| 1,921,035 A | * | 8/1933 | Mason | ................. H03H 9/0095 333/190 |
| 1,967,250 A | * | 7/1934 | Mason | ................. H03H 9/0095 333/189 |

(Continued)

FOREIGN PATENT DOCUMENTS

| JP | 09-98056 A | 4/1997 |
| JP | 11-346140 A | 12/1999 |

(Continued)

OTHER PUBLICATIONS

International Search Report dated Nov. 23, 2012 in International Application No. PCT/KR2012/004612 (7 pages, in Korean with complete English translation).

*Primary Examiner* — Barbara Summons
(74) *Attorney, Agent, or Firm* — NSIP Law (57) ABSTRACT

A filter using bulk acoustic wave resonators (BAWRs) is provided including BAWRs connected in series or in parallel to each other. A BAWR set is configured by connecting an inductance and capacitance (L/C) element to each BAWR in series or in parallel.

7 Claims, 13 Drawing Sheets

(51) Int. Cl.
  *H03H 9/54* (2006.01)
  *H03H 9/00* (2006.01)
  *H03H 9/60* (2006.01)
  *H03H 9/205* (2006.01)

(52) U.S. Cl.
  CPC .............. *H03H 9/60* (2013.01); *H03H 9/205* (2013.01); *H03H 9/605* (2013.01)

(58) Field of Classification Search
  USPC .................................................. 333/189, 190
  See application file for complete search history.

(56) References Cited

U.S. PATENT DOCUMENTS

| | | | | |
|---|---|---|---|---|
| 1,969,571 A * | 8/1934 | Mason | ................. | H03H 9/0095 333/190 |
| 1,974,081 A * | 9/1934 | Mason | ................. | H03H 9/0095 333/190 |
| 2,170,206 A * | 8/1939 | Mason | ..................... | H03H 9/62 310/26 |
| 2,222,417 A * | 11/1940 | Mason | ................. | H03H 9/0095 333/190 |
| 5,789,845 A * | 8/1998 | Wadaka | ................. | H03B 5/326 310/311 |
| 5,933,062 A * | 8/1999 | Kommrusch | ........ | H03H 9/6483 310/313 B |
| 5,969,582 A * | 10/1999 | Boesch | .................... | H03F 1/56 333/129 |
| 6,404,302 B1 * | 6/2002 | Satoh | ................. | H03H 9/6483 333/193 |
| 6,756,864 B2 * | 6/2004 | Muramatsu | .......... | H03H 7/0115 333/133 |
| 6,870,446 B2 * | 3/2005 | Ohara | ................. | H03H 9/0095 310/357 |
| 7,030,718 B1 * | 4/2006 | Scherer | .................... | H03J 3/20 331/117 R |
| 7,696,844 B2 * | 4/2010 | Cathelin | .............. | H03H 9/0095 333/189 |
| 7,821,358 B2 * | 10/2010 | Block | ................. | H03H 9/6423 333/133 |
| 7,876,178 B2 * | 1/2011 | Tamura | ................ | H03H 9/0576 333/133 |
| 8,064,843 B2 * | 11/2011 | Rosetti | .................... | H03H 7/46 333/103 |
| 8,552,818 B2 * | 10/2013 | Kadota | .............. | H03H 9/02559 333/188 |
| 8,581,674 B2 * | 11/2013 | Tanaka | ................ | H03H 9/0561 333/133 |
| 9,148,107 B2 * | 9/2015 | Ueda | ......................... | H03H 3/02 |
| 2008/0246556 A1 | 10/2008 | Heinze et al. | | |
| 2009/0128260 A1 * | 5/2009 | Block | ................. | H03H 9/6483 333/187 |
| 2011/0063051 A1 * | 3/2011 | Fedan | ................. | H03H 9/6406 333/195 |

FOREIGN PATENT DOCUMENTS

| | | |
|---|---|---|
| JP | 2008-205947 A | 9/2008 |
| JP | 2010-178186 A | 8/2010 |
| KR | 10-2003-0076977 A | 9/2003 |
| KR | 10-2004-0079412 A | 9/2004 |
| KR | 10-2005-0089957 A | 9/2005 |
| KR | 10-2007-0017926 A | 2/2007 |
| KR | 10-2011-0013957 A | 2/2011 |
| KR | 10-2011-0026079 A | 3/2011 |
| KR | 10-2011-0081879 A | 7/2011 |

* cited by examiner

FILTER USING BAWRS AND L/C ELEMENTS CONNECTED TO THE BAWRS

CROSS-REFERENCE TO RELATED APPLICATION(S)

This application is a National Phase entry of PCT Application No. PCT/KR2012/004612, filed on Jun. 12, 2012, which claims priority under 35 U.S.C. §119 and 365(c) to Korean Patent Application No. 10-2012-0021312, filed on Feb. 29, 2012, in the Korean Intellectual Property Office, the entire disclosures of which are incorporated herein by reference for all purposes.

BACKGROUND

1. Field

The following description relates to a filter using bulk acoustic wave resonators (BAWRs) and a filter circuit using the BAWRs.

2. Description of Related Art

An analog radio frequency (RF) region is a region ranging from an end of an antenna to an end of a mixer in a communication of a mobile communication terminal.

To use frequencies of various bands in an analog RF region, a number of passive components such as an antenna, a filter, a duplexer, and a matching circuit may proportionally increase. An area used by the passive components and a requirement for a characteristic enhancement may also proportionally increase.

Accordingly, a high performance filter is achieved using bulk acoustic wave resonators (BAWRs) having an excellent resonator characteristic.

In general, a filter using the BAWRs uses a method of arranging the BAWRs in a ladder type or a lattice type using only the BAWRs, or a method of additionally connecting an inductor to a portion of the BAWRs.

When increasing a number of ends to achieve a high performance using the aforementioned structure, there is a difficulty in achieving a desired filter performance in a transmission band due to resonance frequency and anti-resonance frequency characteristics of the BAWRs limited in a process and a twisting of matching occurring between the respective ends.

SUMMARY

In accordance with an illustrative configuration, there is provided a filter using bulk acoustic wave resonators (BAWRs), the filter includes BAWRs connected in series or in parallel to each other, wherein a BAWR set is configured by connecting an inductance and capacitance (L/C) element to each BAWR in series or in parallel.

Each L/C element is configured to control a resonance frequency or an anti-resonance frequency of each BAWR.

A lattice structure circuit is configured by combining corresponding BAWR sets.

The lattice structure circuit may include: a first BAWR set and a second BAWR set connected in series; a third BAWR set may include an end connected to an input end of the first BAWR set and another end connected to an output end of the second BAWR set; and a fourth BAWR set may include an end connected to an output end of the first BAWR set and another end connected to an input end of the second BAWR set.

An L/C element of the first BAWR set and an L/C element of the second BAWR set comprise an identical connection structure.

An L/C element of the third BAWR set and an L/C element of the fourth BAWR set comprise an identical connection structure.

A ladder structure circuit is configured by combining corresponding BAWR sets.

The ladder structure circuit may include: a first BAWR set and a second BAWR set connected in series; and a third BAWR set may include an end connected to an output end of the first BAWR set and another end connected to an output end of the second BAWR set.

The ladder structure circuit may include: a first BAWR set and a second BAWR set connected in series; and a third BAWR set may include an end connected to an input end of the first BAWR set and another end connected to an input end of the second BAWR set.

In accordance with an illustrative example, there is provided a filter circuit using bulk acoustic wave resonators (BAWRs), the filter circuit including BAWRs connected in series or in parallel to each other and a BAWR end configured as an inductance and capacitance (L/C) element connected to each BAWR in series or in parallel; and a matching end provided between the BAWR ends or between input and output ends to match a frequency between the BAWR ends.

The matching end may include an L/C element connected in series or in parallel.

The matching end is configured to control a frequency transmission characteristic and a reflection characteristic of a signal passing between the BAWR ends or between input and output ends.

A ladder structure circuit is configured by combining corresponding BAWR sets, and wherein the ladder structure circuit configures a single input/output structure by connecting a first BAWR set and a second BAWR set to each other.

An end of the second BAWR set is connected in parallel to an input end or an end of a first BAWR, which is connected to the input end in series, and another end of the second BAWR set is connected to a ground.

In the matching end, an end of an L/C element connected in parallel is connected to an input end or an end of an L/C element connected in series, and another end of the L/C element connected in parallel is connected to the ground.

In accordance with an illustrative example, there is provided a filter circuit using bulk acoustic wave resonators (BAWRs), including: BAWRs connected in series or in parallel to each other and a BAWR end configured as an inductance and capacitance (L/C) element connected to each BAWR in series or in parallel, and wherein in response to a frequency transmission characteristic and a reflection characteristic of a signal passing between the BAWR ends or between input and output ends reaching a predetermined characteristic value, a matching end provided between the BAWR ends or between input and output ends to match a frequency between the BAWR ends is not configured.

According to embodiments, a filter having small noise and having an excellent characteristic is achieved by configuring the filter to include bulk acoustic wave resonators (BAWRs) having an excellent resonator characteristic.

DETAILED DESCRIPTION

Hereinafter, example embodiments will be described in detail with reference to the accompanying drawings. However, the present disclosure is not limited thereto or restricted thereby. Like reference numerals refer to like elements throughout.

When it is determined detailed description related to a related known function or configuration they may make the purpose unnecessarily ambiguous in describing the present disclosure, the detailed description will be omitted here. Also, terminologies used herein are defined to appropriately describe the example embodiments and thus, may be changed depending on a user, the intent of an operator, or a custom. Accordingly, the terminologies must be defined based on the following overall description of this specification.

A filter using bulk acoustic wave resonators (BAWRs), according to example embodiments, provides a degree of freedom for limited resonance frequency and an anti-resonance frequency characteristics of the BAWRs by connecting an inductance and capacitance (L/C) circuit, such as an inductor, a capacitor and the like, to the BAWRs in series or in parallel.

A filter using BAWRs, according to example embodiments, prevents a degradation in a filter performance occurring due to twisting of a matching between BAWR ends by adding a matching end that is an L/C network between BAWR ends, and improves the filter performance in a transmission band.

Prior to describing the filter using the BAWRs, according to example embodiments, a structure and performance of a BAWR will be described.

Figure 1:
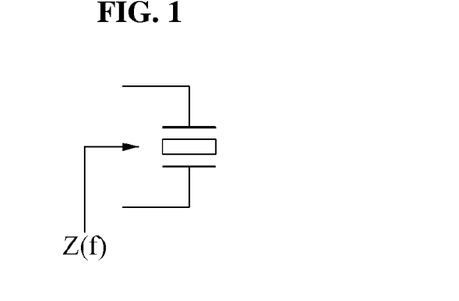
FIG. 1 is a diagram illustrating a circuit sign, in accordance with an embodiment.
Figure 2:
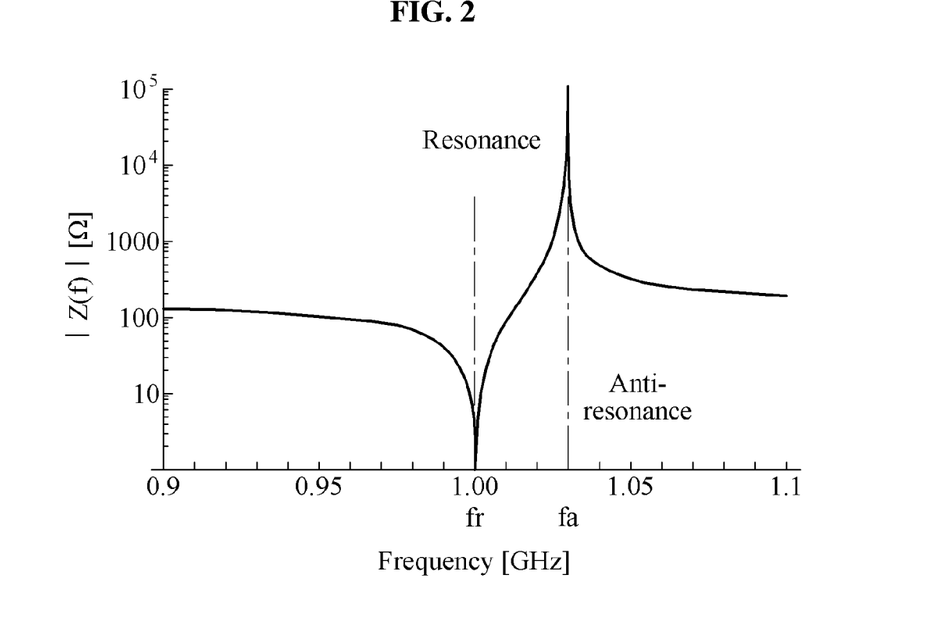
FIG. 2 is a graph illustrating characteristics of a resonance frequency and an anti-resonance frequency of bulk acoustic wave resonators (BAWRs) input impedance, in accordance with an embodiment.

FIG. 1 is a diagram illustrating a circuit sign, and FIG. 2 is a graph illustrating characteristics of a resonance frequency and an anti-resonance frequency of a BAWR input impedance, in accordance with an embodiment.

FIG. 1 illustrates a general BAWR, and the graph of FIG. 2 relates to a resonance frequency (fr) and an anti-resonance frequency (fa) of impedance with respect to a BAWR input.

Figure 3:
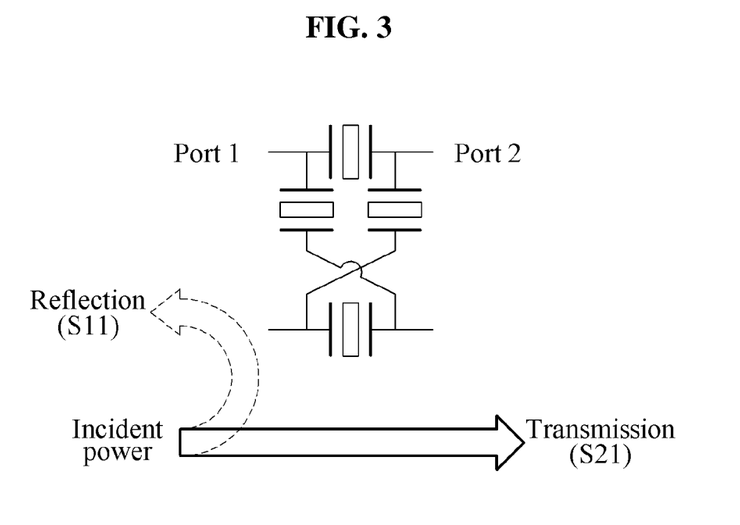
FIG. 3 is a diagram illustrating an example of a configuration of a filter configured using only BAWRs, in accordance with an embodiment.
Figure 4:
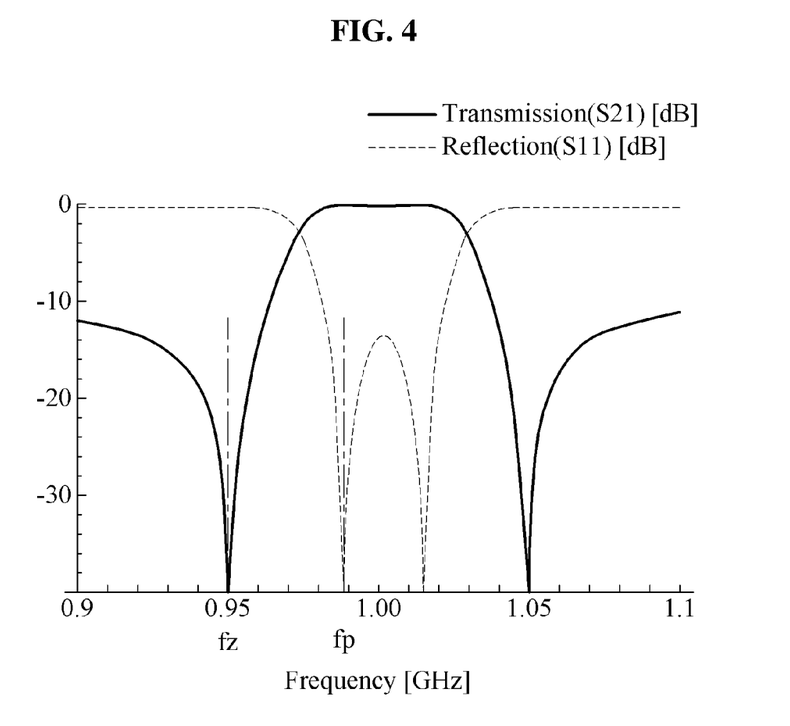
FIG. 4 is a graph illustrating a characteristic of a band having passed the filter of FIG. 3, in accordance with an embodiment.

FIG. 3 is a diagram illustrating an example of a configuration of a filter, and FIG. 4 is a graph illustrating a characteristic of a band having passed the filter of FIG. 3, in accordance with an embodiment.

Referring to FIGS. 3 and 4, a structure of a single end of a BAWR lattice filter and a frequency characteristic appear as a transmission zero point (fz) in a transmission characteristic of FIG. 4 and a reflection zero point (fz) in a reflection characteristic of FIG. 4. Accordingly, the transmission zero point, fz, and the reflection zero point, fp, are determined based on the resonance frequency and the anti-resonance frequency of the BAWRs.

Hereinafter, the filter using the BAWRs, according to example embodiments, will be described based on characteristics of the BAWRs.

Figure 5:
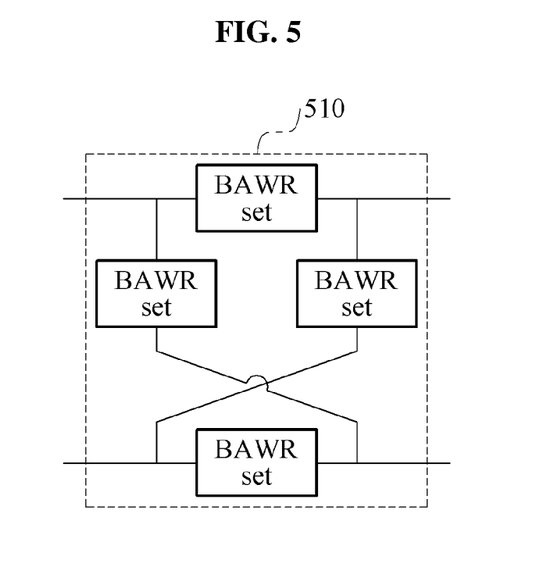
FIG. 5 is a diagram illustrating an example of a configuration of a filter using BAWRs, in accordance with an embodiment.

FIG. 5 is a diagram illustrating an example of a configuration of a filter using BAWRs, in accordance with an embodiment.

Referring to FIG. 5, the filter using the BAWRs includes at least two BAWRs connected in series or in parallel to each other, and a BAWR set is configured by connecting at least one L/C element to each BAWR in series or in parallel.

According to example embodiments, each L/C element is configured to control a resonance frequency or an anti-resonance frequency of each BAWR.

FIGS. 6 through 10 are diagrams illustrating examples of a configuration of a BAWR set in which a BAWR and an L/C element are combined, in accordance with an embodiment.

According to an embodiment, a BAWR set, in which a BAWR and an L/C element are combined, may be provided in various structures.

Figure 6:
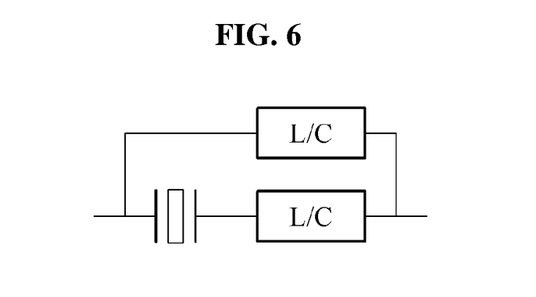
FIGS. 6 through 10 are diagrams illustrating examples of a configuration of a BAWR set in which the BAWR and an inductance and capacitance (L/C) element are combined, in accordance with an embodiment.
Figure 7:
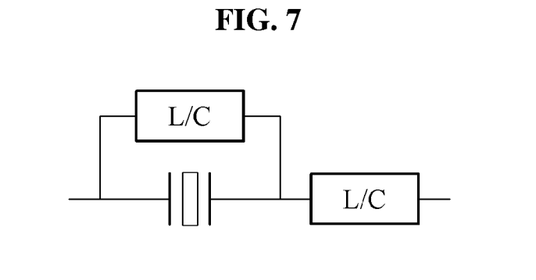
Figure 8:
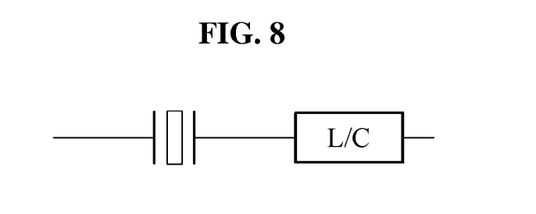
Figure 9:
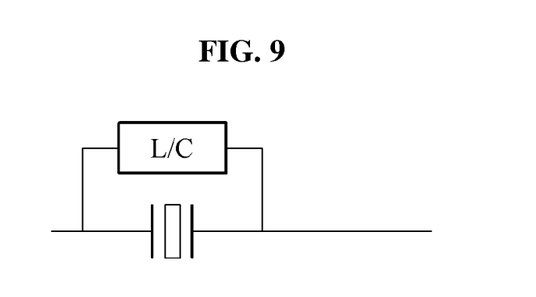

For example, as illustrated in FIGS. 6 and 7, in a BAWR set, a single LC element is connected or operatively connected to a BAWR in series and a single L/C element is connected or operatively connected thereto in parallel. As illustrated in FIGS. 8 and 9, a single L/C element is connected to a BAWR in series or in parallel.

Figure 10:
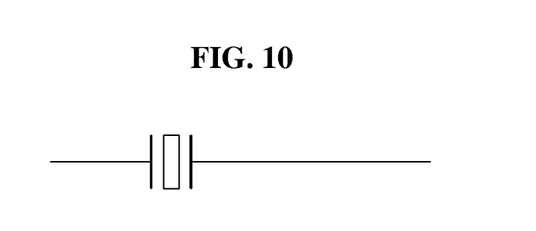

As another example, although a BAWR set may only use a BAWR, as illustrated in FIG. 10, a BAWR set in a different structure may be combined with other structural elements, instead of being a single structure.

A filter using BAWRs, according to an embodiment, is provided in various circuit structures.

Referring to FIG. 5, the filter using the BAWRs configures at least one lattice structure circuit 510 by combining the corresponding BAWR sets.

The lattice structure circuit 510 includes a first BAWR set and a second BAWR set connected in series. The lattice structure circuit 510 also includes a third BAWR set having an end connected to an input end of the first BAWR set and another end connected to an output end of the second BAWR set. Further, the lattice structure circuit 510 includes a fourth BAWR set having an end connected to an output end of the first BAWR set and another end connected to an input end of the second BAWR set.

According to an embodiment, in the lattice structure circuit 510, the symmetric BAWR sets have an identical structure.

For example, an L/C element of the first BAWR set and an L/C element of the second BAWR set in a symmetric relationship have an identical connection structure, and an L/C element of the third BAWR set and an L/C element of the fourth BAWR set in a symmetric relationship have an identical connection structure.

Figure 11:
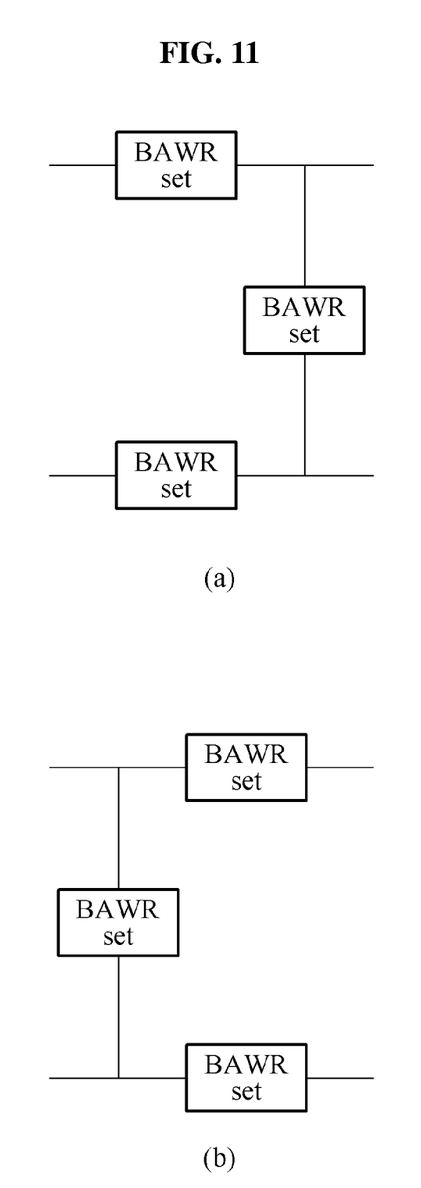
FIG. 11 is a diagram illustrating other examples of a configuration of a filter using BAWRs, in accordance with an embodiment.

FIG. 11 is a diagram illustrating other examples of a configuration of a filter using BAWRs, according to an embodiment.

As illustrated in (a) and (b) of FIG. 11, in the filter using the BAWRs, at least one ladder structure circuit is configured by combining the respective BAWR sets.

According to an embodiment, the ladder structure circuit includes at least one first BAWR set and at least one second BAWR set connected in series. The ladder structure circuit also includes a third BAWR set having an end connected to an output end of the at least one first BAWR set and another end connected to an output end of the at least one second BAWR set.

According to an embodiment, the ladder structure circuit includes at least one first BAWR set and at least one second BAWR set connected in series. The ladder structure circuit also includes a third BAWR set having an end connected to an input end of the at least one first BAWR set and another end connected to an input end of the at least one second BAWR set.

Figure 12:
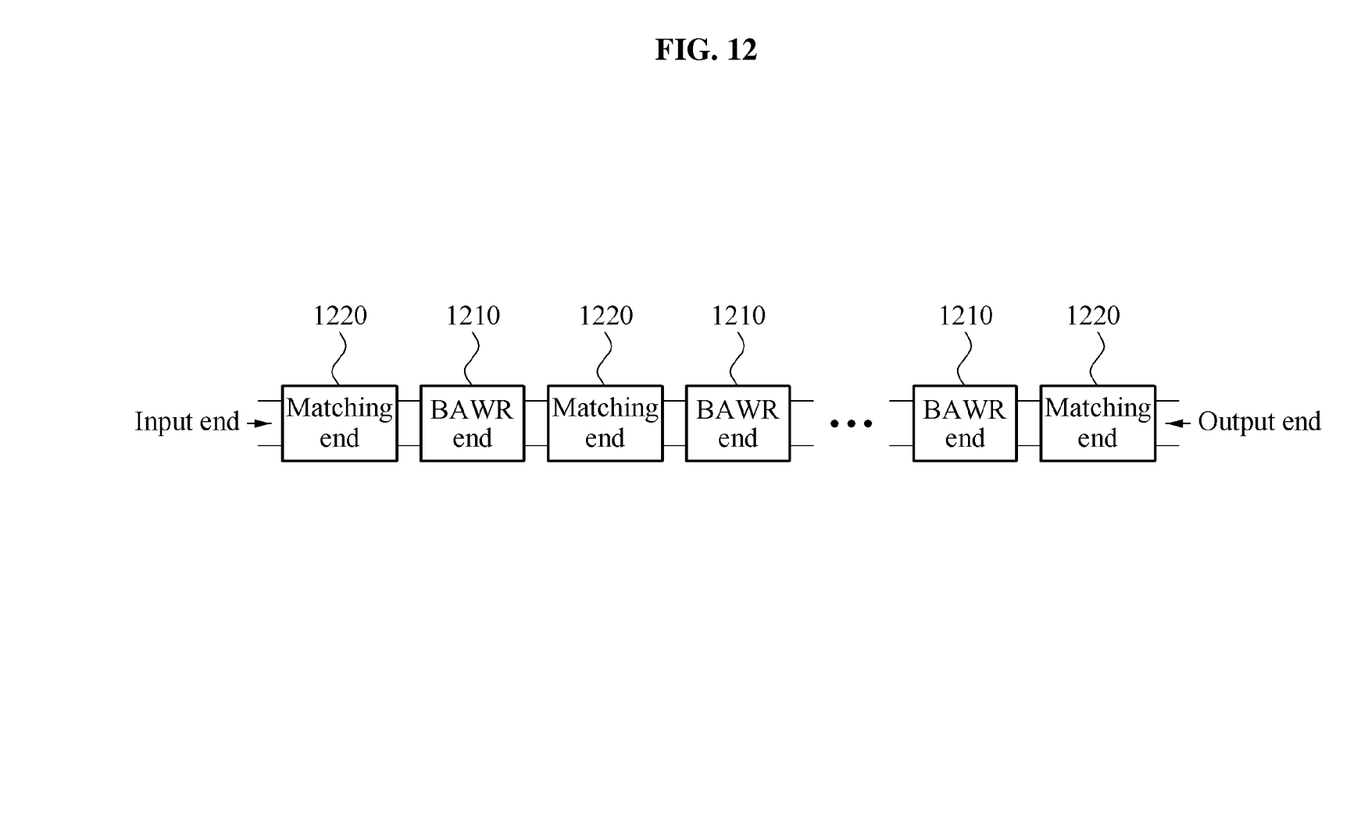
FIG. 12 is a diagram illustrating an example of a configuration of a filter circuit using BAWRs, in accordance with an embodiment.
Figure 13:
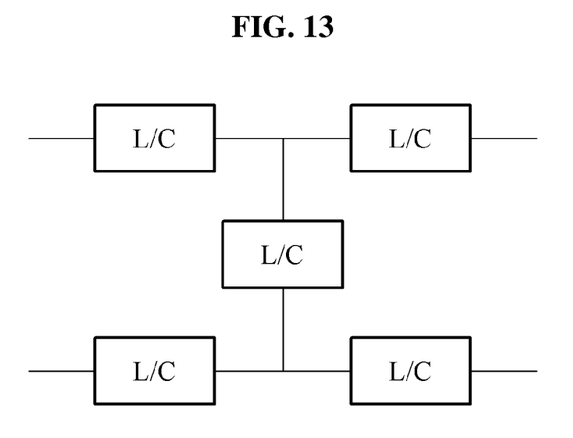
FIGS. 13 through 16 are diagrams illustrating examples of a configuration of a matching end, in accordance with an embodiment.
Figure 14:
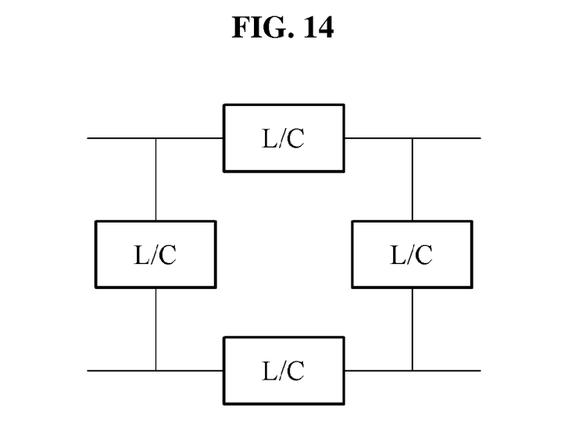
Figure 15:
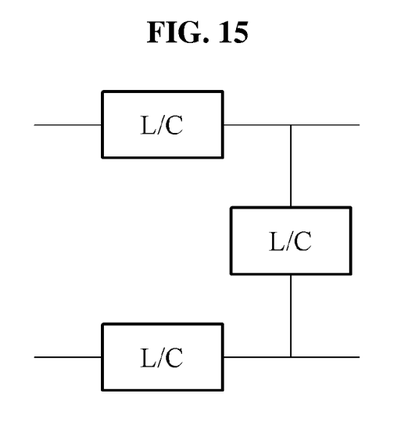
Figure 16:
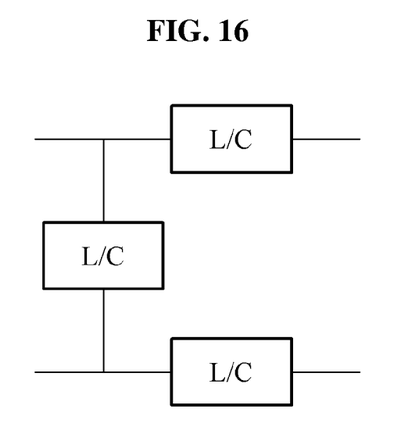

FIG. 12 is a diagram illustrating a configuration of a filter circuit using BAWRs, in accordance with an embodiment.

Referring to FIG. 12, the filter circuit using the BAWRs includes at least two BAWRs connected in series or in parallel to each other, and at least one BAWR end 1210 configured as at least one L/C element connected to each BAWR in series or in parallel. The filter circuit using the BAWRs also includes at least one matching end 1220 provided between the BAWR ends 1210 or between input and output ends to match a frequency between the BAWR ends 1210.

When a frequency transmission characteristic and a reflection characteristic of a signal passing between the BAWR ends 1210 or between the input and output ends reach a predetermined characteristic value, that is, when the frequency transmission characteristic and the reflection characteristic are relatively superior, the filter circuit using the BAWRs, according to example embodiments, is configured to use only the at least one BAWR end 1210. The filter circuit would not use the at least one matching end 1220 provided between the BAWR ends or between the input and output ends to match a frequency between the BAWR ends.

FIGS. 13 through 16 are diagrams illustrating examples of a configuration of a matching end, in accordance with an embodiment.

Referring to FIGS. 13 through 16, the at least one matching end 1220 is configured using at least one L/C element connected in series or parallel.

According to example embodiments, the at least one matching end 1220 is configured to control a frequency transmission characteristic and a reflection characteristic of a signal passing between the BAWR ends 1210 or between the input and output ends.

Figure 17:
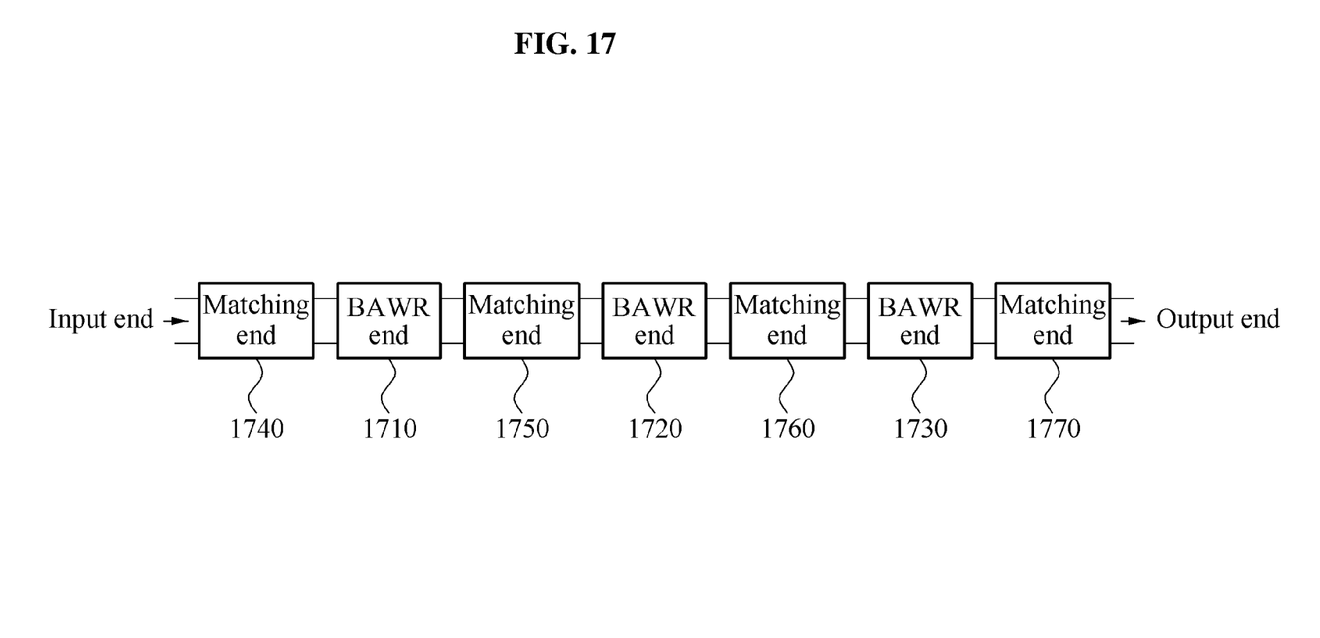
FIG. 17 is a diagram illustrating a filter circuit including three BAWR ends, in accordance with an embodiment.
Figure 18:
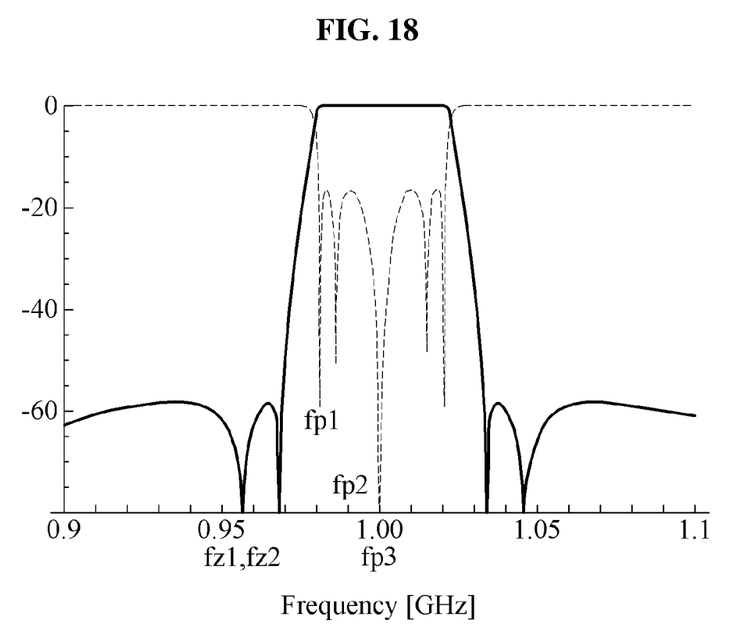
FIG. 18 is a graph illustrating a frequency characteristic of the filter circuit of FIG. 17, in accordance with an embodiment.

FIG. 17 is a diagram illustrating a filter circuit including three BAWR ends, in accordance with an embodiment, and FIG. 18 is a graph illustrating a frequency characteristic of the filter circuit in FIG. 17, in accordance with an embodiment.

Referring to FIG. 17, the filter circuit using the BAWRs configures, as multiple ends of a BAWR filter, an elliptic filter indicating a plurality of frequency transmission characteristics (fz) and frequency reflection characteristics (fp). Also, BAWR ends 1710, 1720, and 1730 each is configured with a different resonance frequency and anti-resonance frequency for each end.

According to an aspect, at least one matching end, for example, each of matching ends 1740, 1750, 1760, and 1770, is provided between the BAWR ends and between input and output ends. Accordingly, it is possible to prevent a degradation in a frequency transmission characteristic and a reflection characteristic that may occur due to a matching twisted between the BAWR ends and between the input and output end.

Referring to FIG. 18, the filter circuit using the BAWRs obtains a desired degree of freedom by adjusting a frequency transmission characteristic (fz) and a frequency reflection characteristic (fp).

According to an aspect, a filter having excellent superior characteristic is achieved using BAWRs having an excellent resonator characteristic.

The filter using the BAWRs is configured as a balanced input/output RF filter or a single input/output RF filter to reduce noise.

Figure 19:
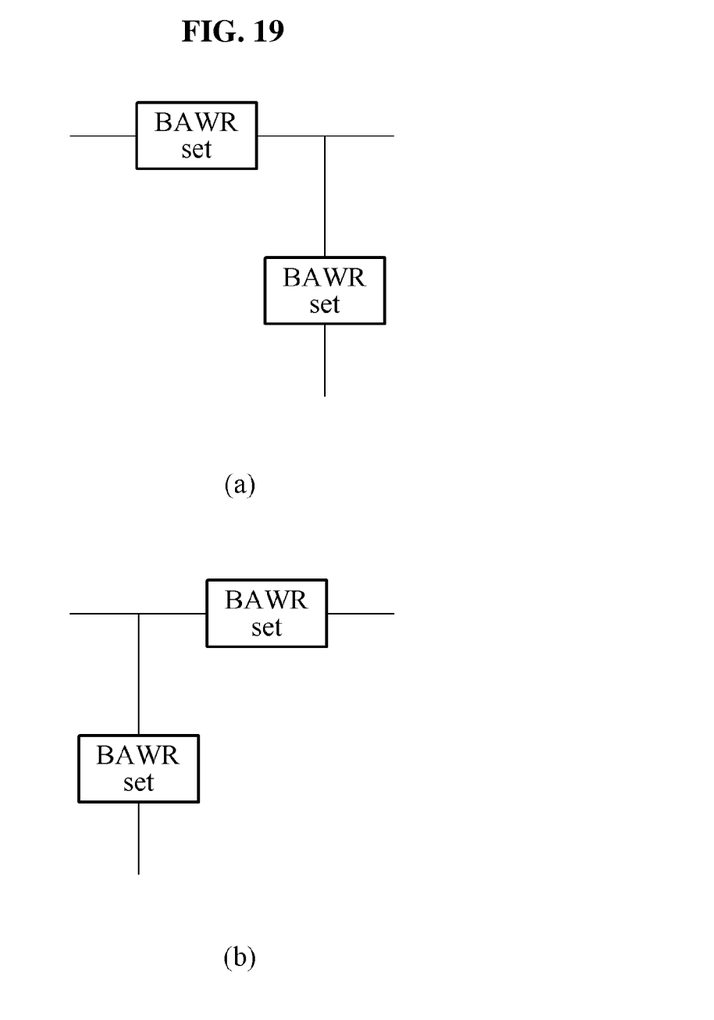
FIG. 19 is a diagram illustrating another example of a configuration of a filter using BAWRs, in accordance with an embodiment.
Figure 20:
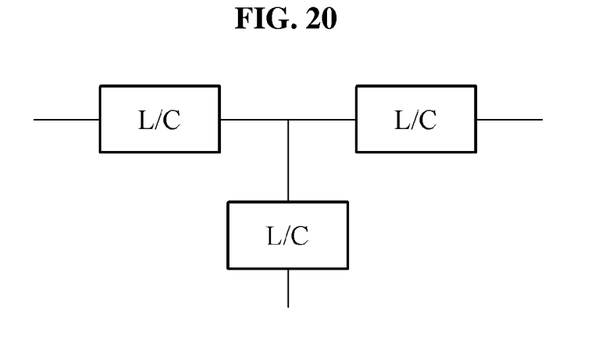
FIGS. 20 through 23 are diagrams illustrating other examples of a configuration of a matching end, in accordance with an embodiment.
Figure 21:
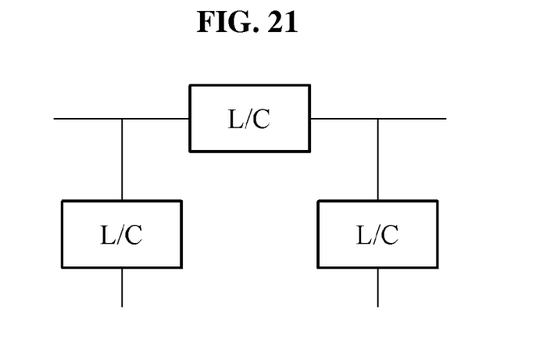
Figure 22:
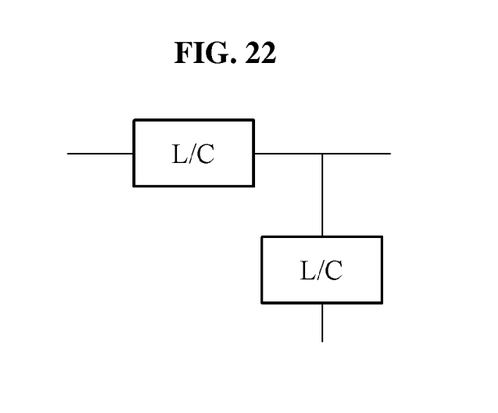
Figure 23:
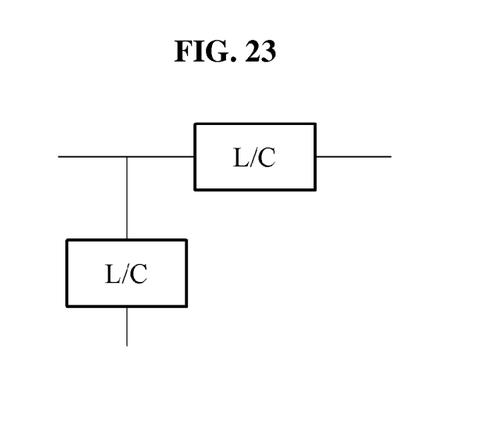

FIG. 19 is a diagram illustrating another example of a configuration of a filter using BAWRs, in accordance with an embodiment.

As illustrated in (a) and (b) of FIG. 19, the filter using the BAWRs configures at least one ladder structure circuit by combining the respective BAWR sets. The ladder structure circuit configures a single input/output structure by connecting a first BAWR set and a second BAWR set (not separately classified in FIG. 19) to each other.

According to an embodiment, an end of the second BAWR set is connected in parallel to an input end or an end of a first BAWR, which is connected to the input end in series, and another end of the second BAWR set is connected to a ground.

FIGS. 20 through 23 are diagrams illustrating other examples of a configuration of a matching end, in accordance with an embodiment.

Referring to FIGS. 20 through 23, in at least one matching end, according to example embodiments, an end of an L/C element connected in parallel is connected to an input end or an end of an L/C element connected in series, and another end of the L/C element connected in parallel is connected to a ground.

According to an aspect, an elliptic filter to include excellent performances of a frequency transmission characteristic (attenuation loss) and a frequency reflection characteristic (return loss) is configured by connecting an L/C element to a BAWR in series or in parallel and adjusting resonance frequency and anti-resonance frequency characteristics of the BAWR.

Although a few example embodiments have been shown and described, the present disclosure is not limited to the described example embodiments. Instead, it would be appreciated by those skilled in the art that changes may be made to these example embodiments without departing from the principles and spirit of the disclosure, the scope of which is defined by the claims and their equivalents.

The invention claimed is:

1. A filter circuit using bulk acoustic wave resonators (BAWRs), the filter circuit comprising:
   a plurality of BAWR ends comprising a plurality of BAWR sets connected in series or in parallel to each other; and
   a matching end provided between the plurality of BAWR ends to match a frequency between the plurality of BAWR ends,
   wherein each of the plurality of BAWR sets comprises a BAWR and an inductance and capacitance (L/C) element connected to the BAWR in series or in parallel,
   wherein each of the plurality of BAWR ends comprises the plurality of BAWR sets in a lattice structure.

2. The filter circuit of claim 1, wherein the matching end comprises an L/C element connected in series or in parallel.

3. The filter circuit of claim 1, wherein the matching end is configured to control a frequency transmission characteristic and a reflection characteristic of a signal passing between the BAWR ends or between input and output ends.

4. The filter circuit of claim 3, wherein, in the matching end, an end of an L/C element connected in parallel is connected to an input end or an end of an L/C element connected in series.

5. The filter circuit of claim 1, wherein the plurality of BAWR sets in a lattice structure comprises:
   a first BAWR set and a second BAWR set connected in series in respective first and second signal lines;
   a third BAWR set comprising an end connected to an input end of the first BAWR set and another end connected to an output end of the second BAWR set; and
   a fourth BAWR set comprising an end connected to an output end of the first BAWR set and another end connected to an input end of the second BAWR set.

6. The filter circuit of claim 5, wherein an L/C element of the first BAWR set and an L/C element of the second BAWR set comprise an identical connection structure.

7. The filter circuit of claim 5, wherein an L/C element of the third BAWR set and an L/C element of the fourth BAWR set comprise an identical connection structure.

* * * * *